US012702049B2

(12) United States Patent
Tang et al.

(10) Patent No.: US 12,702,049 B2
(45) Date of Patent: Aug. 4, 2026

(54) ELECTRICAL CIRCUIT BODY, POWER CONVERTER, AND ELECTRICAL CIRCUIT BODY MANUFACTURING METHOD

(71) Applicant: Hitachi Astemo, Ltd., Hitachinaka (JP)

(72) Inventors: Ning Tang, Tokyo (JP); Nobutake Tsuyuno, Tokyo (JP); Yujiro Kaneko, Hitachinaka (JP); Eiichi Ide, Tokyo (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 483 days.

(21) Appl. No.: 18/039,896

(22) PCT Filed: Sep. 29, 2021

(86) PCT No.: PCT/JP2021/036023
§ 371 (c)(1),
(2) Date: Jun. 1, 2023

(87) PCT Pub. No.: WO2022/123870
PCT Pub. Date: Jun. 16, 2022

(65) Prior Publication Data
US 2024/0038611 A1      Feb. 1, 2024

(30) Foreign Application Priority Data
Dec. 10, 2020    (JP) ................................. 2020-205422

(51) Int. Cl.
*H10W 74/10*        (2026.01)
*H10W 40/47*        (2026.01)
(Continued)

(52) U.S. Cl.
CPC .......... *H10W 74/114* (2026.01); *H10W 40/47* (2026.01); *H10W 74/017* (2026.01);
(Continued)

(58) Field of Classification Search
CPC .................................................... H01L 23/3121
(Continued)

(56) References Cited

U.S. PATENT DOCUMENTS

2012/0001318 A1    1/2012  Mamitsu et al.
2014/0168901 A1*   6/2014  Ide ......................... H05K 7/209
                                                    361/717

FOREIGN PATENT DOCUMENTS

JP          2012-33872 A       2/2012
JP          2013-73964 A       4/2013
(Continued)

OTHER PUBLICATIONS

International Search Report (PCT/ISA/210) issued in PCT Application No. PCT/JP2021/036023 dated Dec. 7, 2021 with English translation (five (5) pages).
(Continued)

*Primary Examiner* — Ajay Arora
(74) *Attorney, Agent, or Firm* — Crowell & Moring LLP

(57) ABSTRACT

An electrical circuit body includes a power semiconductor element joined to one face of a conductor plate, a sheet member including an insulating layer joined to the other face of the conductor plate, a sealing member integrally sealing the sheet member, the conductor plate, and the power semiconductor element in a state where a face, of the sheet member, opposite to a face joined to the conductor plate is exposed, and a cooling member bonded to the opposite face of the sheet member via a heat conduction member, wherein the sealing member has a recess along an outer edge of the sheet member on a surface where the sheet member is exposed, the recess being located outside the sheet member.

11 Claims, 17 Drawing Sheets

(51) Int. Cl.
| | |
|---|---|
| *H10W 74/01* | (2026.01) |
| *H10W 90/00* | (2026.01) |
| *H10W 72/00* | (2026.01) |
| *H10W 72/60* | (2026.01) |

(52) U.S. Cl.
CPC .......... *H10W 90/00* (2026.01); *H10W 72/647* (2026.01); *H10W 72/652* (2026.01); *H10W 72/655* (2026.01); *H10W 72/871* (2026.01); *H10W 90/756* (2026.01); *H10W 90/763* (2026.01); *H10W 90/811* (2026.01)

(58) Field of Classification Search
USPC ........................................................ 257/712
See application file for complete search history.

(56) References Cited

FOREIGN PATENT DOCUMENTS

| | | | | | |
|---|---|---|---|---|---|
| JP | 2013258334 A | * | 12/2013 | ............. | H01L 24/40 |
| JP | 2020-88019 A | | 6/2020 | | |
| WO | WO 2018/159209 A1 | | 9/2018 | | |

OTHER PUBLICATIONS

Japanese-language Written Opinion (PCT/ISA/237) issued in PCT Application No. PCT/JP2021/036023 dated Dec. 7, 2021 (five (5) pages).

* cited by examiner

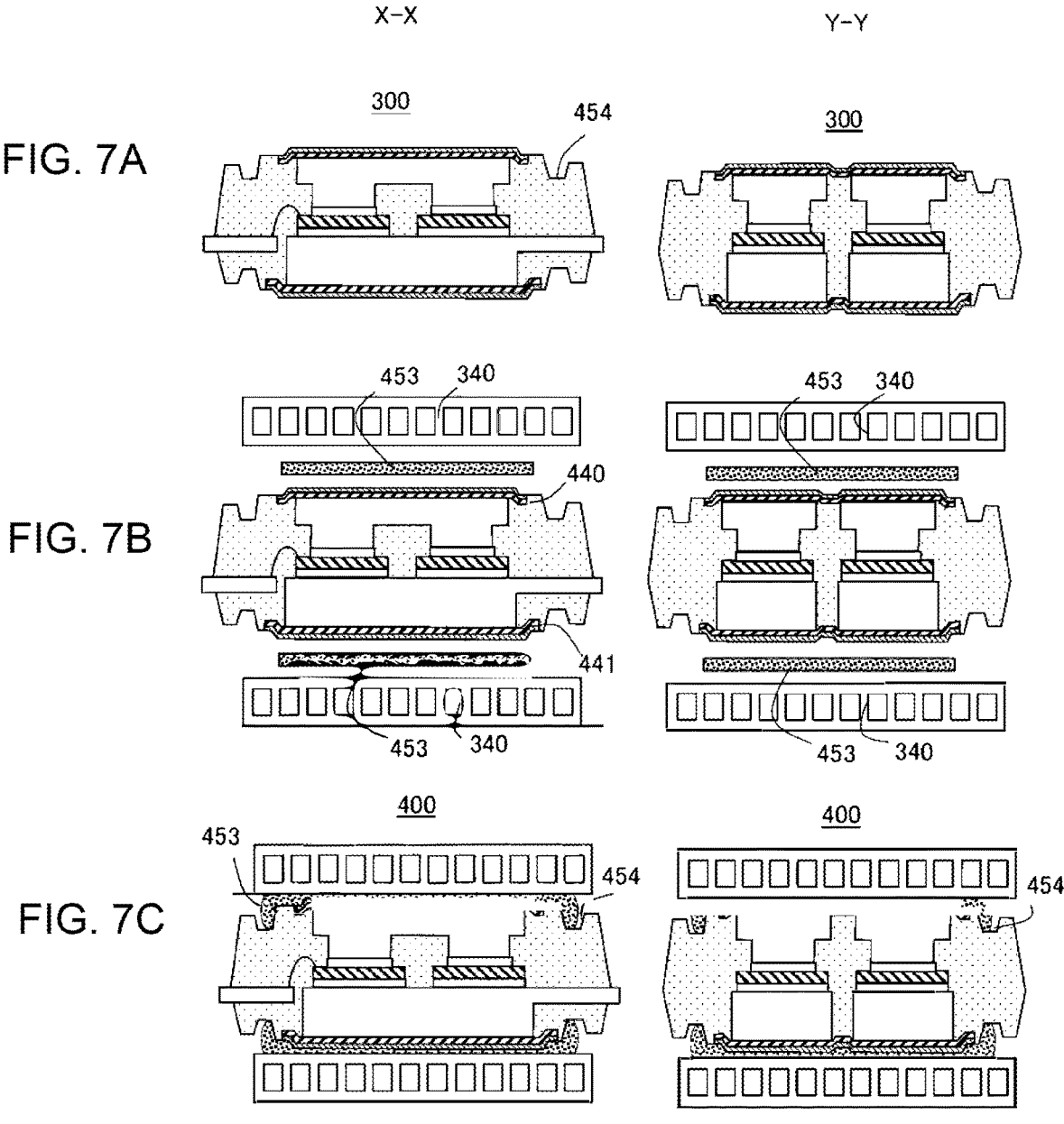

ELECTRICAL CIRCUIT BODY, POWER CONVERTER, AND ELECTRICAL CIRCUIT BODY MANUFACTURING METHOD

TECHNICAL FIELD

The present invention relates to an electrical circuit body, a power converter, and a method for manufacturing the electrical circuit body.

BACKGROUND ART

A power converter using switching of a power semiconductor element has high conversion efficiency, and thus is widely used for consumer use, in-vehicle use, railway use, transformation equipment, and the like. Since the power semiconductor element generates heat by energization, a device incorporating the power semiconductor element is provided with a cooling member via a heat conduction member. The heat conduction member is a flowable material that reduces the contact thermal resistance, and reduces the contact thermal resistance with the cooling member, and the heat conduction member contains a material having a low insulating property. For example, for in-vehicle use, a small and lightweight device is used, and high reliability is required for insulation.

PTL 1 discloses a semiconductor device in which a conductor is connected to a semiconductor element, and is connected to a sheet member in which an electrically insulating layer and a conductive conductor layer are stacked, and they are sealed with a mold resin, and is in contact with a cooling unit via a heat conduction member of a viscous body.

CITATION LIST

Patent Literature

PTL 1: JP 2012-033872 A

SUMMARY OF INVENTION

Technical Problem

In the device described in PTL 1, when the heat conduction member is squeezed out, insulation cannot be secured, and reliability of the device is deteriorated.

Solution to Problem

An electrical circuit body according to the present invention includes a power semiconductor element joined to one face of a conductor plate, a sheet member including an insulating layer joined to the other face of the conductor plate, a sealing member integrally sealing the sheet member, the conductor plate, and the power semiconductor element in a state where a face, of the sheet member, opposite to a face joined to the conductor plate is exposed, and a cooling member bonded to the opposite face of the sheet member via a heat conduction member, wherein the sealing member has a recess along an outer edge of the sheet member on a surface where the sheet member is exposed, the recess being located outside the sheet member.

In a method for manufacturing an electrical circuit body according to the present invention, where the electrical circuit body includes a power semiconductor element Mined to one face of a conductor plate, a sheet member including an insulating layer joined to the other face of the conductor plate, a sealing member integrally sealing the sheet member, the conductor plate, and the power semiconductor element in a state where a face, of the sheet member, opposite to a face joined to the conductor plate is exposed, and a cooling member bonded to the opposite face of the sheet member via a heat conduction member, the method includes holding the sheet member by a mold in which a protrusion is formed corresponding to an outer periphery of the sheet member, pressurizing the mold to join the sheet member to the other face of the conductor plate, performing sealing with the sealing member, and forming a recess, in the sealing member, corresponding to the protrusion of the mold.

Advantageous Effects of Invention

According to the present invention, the heat conduction member is prevented from being squeezed out, insulation is secured, and reliability of the device is improved.

BRIEF DESCRIPTION OF DRAWINGS

FIG. 3 is a cross-sectional view of the electrical circuit body taken along line Y-Y.

FIGS. 7A to 7C are cross-sectional views illustrating a method of manufacturing an electrical circuit body.

DESCRIPTION OF EMBODIMENTS

Figure 1:
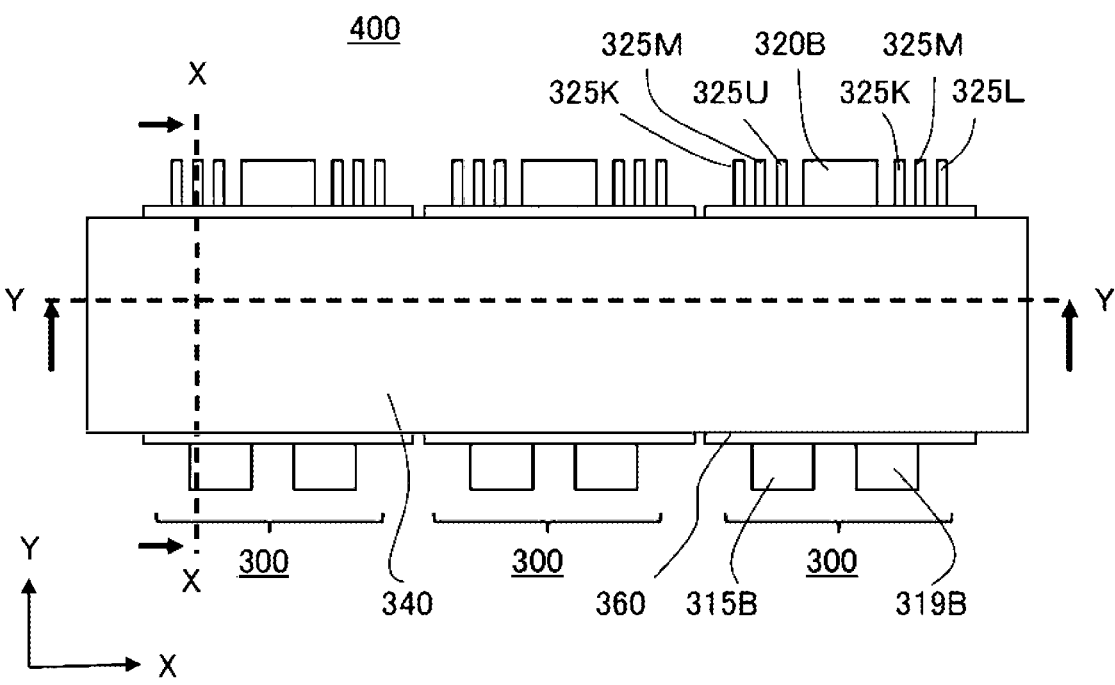
FIG. 1 is a plan view of an electrical circuit body.

Hereinafter, the embodiment of the present invention will be described with reference to the drawings. The following description and drawings are examples for describing the present invention, and are omitted and simplified as appropriate for the sake of clarity of description. The present invention can be carried out in various other forms. Unless otherwise specified, each component may be singular or plural.

Positions, sizes, shapes, ranges, and the like of the components illustrated in the drawings may not represent actual positions, sizes, shapes, ranges, and the like in order to facilitate understanding of the invention. Therefore, the present invention is not necessarily limited to the position, size, shape, range, and the like disclosed in the drawings.

In a case where there is a plurality of components having the same or similar functions, the same reference numerals may be attached with different subscripts for description. However, in a case where it is not necessary to distinguish the plurality of components, the description may be made while omitting the subscript.

Figure 2:
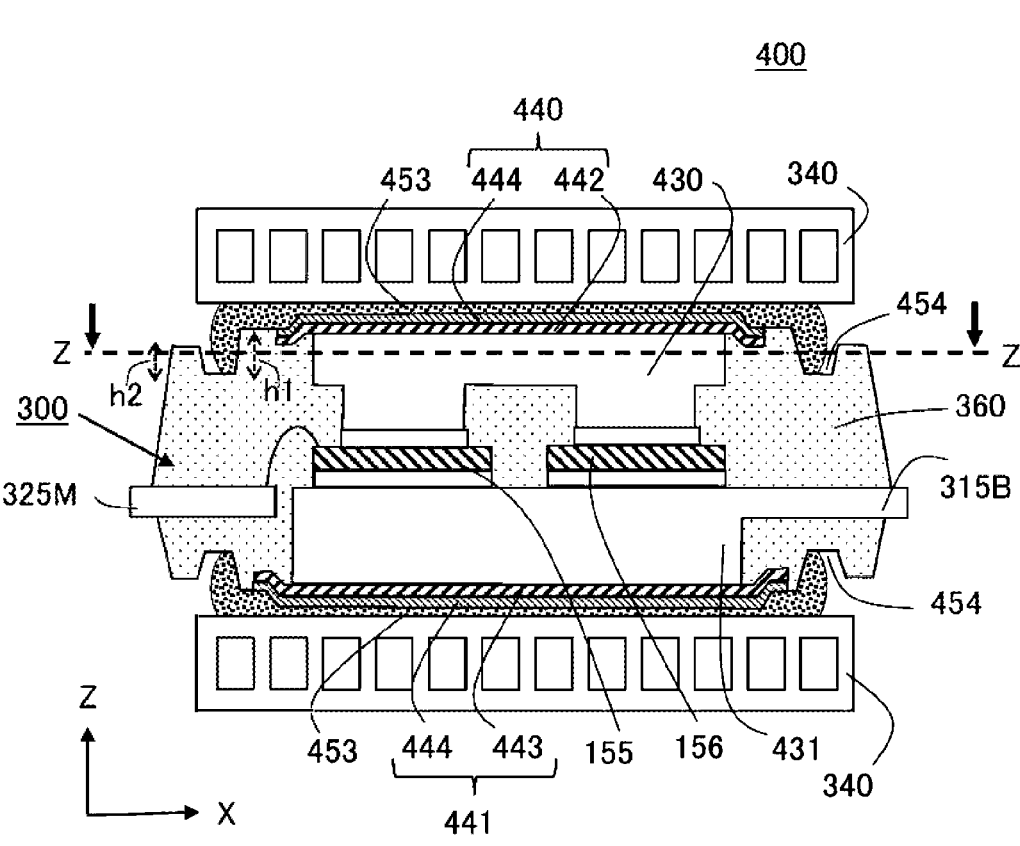
FIG. 2 is a cross-sectional view of the electrical circuit body taken along line X-X.
Figure 3:
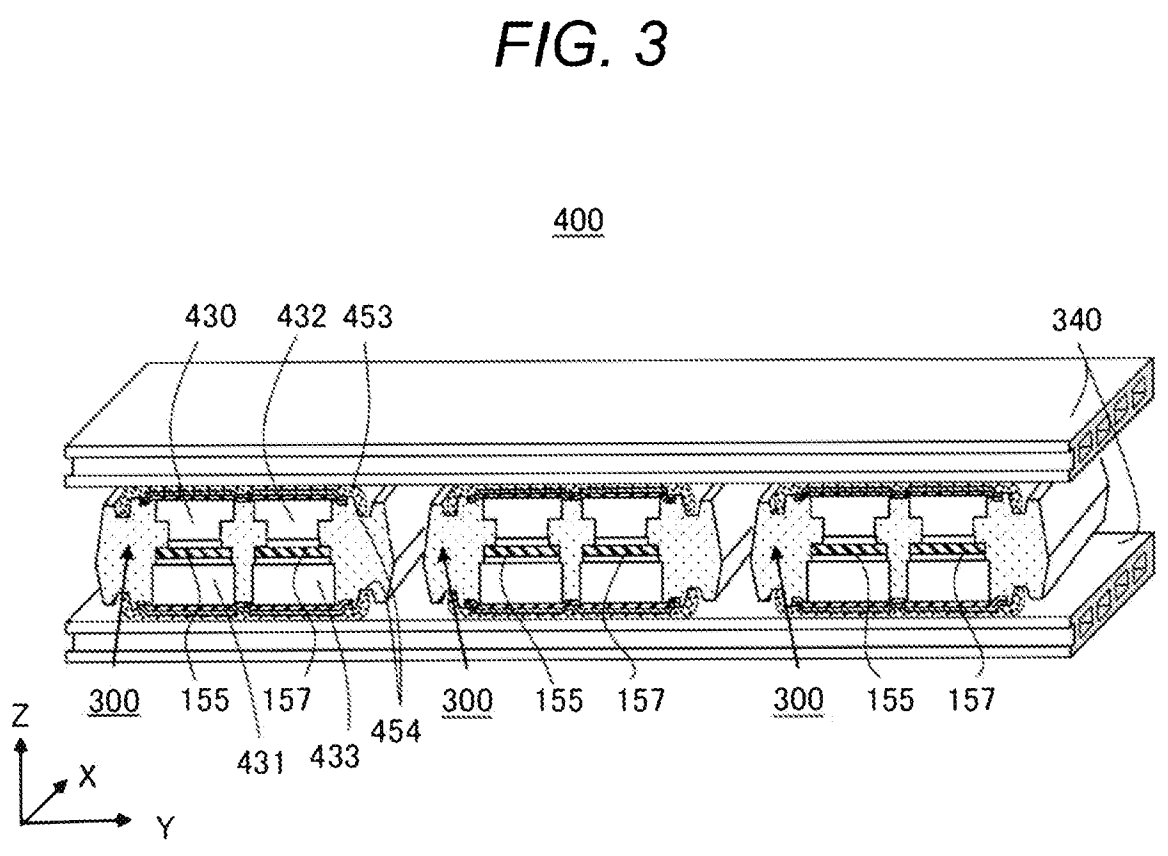

FIG. 1 is a plan view of an electrical circuit body 400, and FIG. 2 is a cross-sectional view of the electrical circuit body 400 taken along line X-X illustrated in FIG. 1. FIG. 3 is a cross-sectional view of the electrical circuit body 400 taken along line Y-Y illustrated in FIG. 1.

As illustrated in FIG. 1, the electrical circuit body 400 includes three power modules 300 and a cooling member 340. The power module 300 has a function of converting a direct current into an alternating current using a power semiconductor element, and generates heat by energization. Therefore, the electrical circuit body is configured to cool the power module with the cooling member 340 in which the refrigerant circulates. Examples of the refrigerant include water, an antifreeze liquid in which ethylene glycol is mixed with water, and the like. The cooling member 340 may have a configuration in which pin-shaped fins are erected on a base plate of the cooling member 340. Cooling member 340 is desirably made of aluminum-based material having high thermal conductivity and light weight. The cooling member 340 is manufactured by extrusion molding, forging, brazing, or the like.

The power module 300 includes, on one side, a positive electrode terminal 315B and a negative electrode terminal 319B coupled to a capacitor module 500 (see FIG. 15 described later) of a DC circuit. The power module includes, on the other side away from the positive electrode terminal 315B and the negative electrode terminal 319B, a power terminal such as an AC terminal 320B connected to motor generators 192 and 194 (see FIG. 15 to be described later) of the AC circuit through which a large current flows. In addition, it includes, on the other side, signal terminals and the like used for controlling the power module 300, such as a lower arm gate signal terminal 325L, a mirror emitter signal terminal 325M, a kelvin emitter signal terminal 325K, and an upper arm gate signal terminal 325U.

As illustrated in FIG. 2, it includes an active element 155 and a diode 156 as the first power semiconductor element forming the upper arm circuit. Examples of the semiconductor material constituting the active element 155 may include Si, SiC, GaN, GaO, C, and the like. When the body diode of the active element 155 is included, the diode 156 may be omitted. The collector of the active element 155 and the cathode of the diode 156 are joined to a second conductor plate 431. The emitter of the active element 155 and the anode of the diode 156 are joined to a first conductor plate 430. Solder or sintered metal may be used for the joining. In addition, the first conductor plate 430 and the second conductor plate 431 are not required to be a specific material as long as they are made of a material having high electrical conductivity and high thermal conductivity, but a copper-based or aluminum-based material is desirable. The material may be used by itself, but may be plated with Ni, Ag, or the like in order to improve joinability with solder or a sintered metal.

The cooling member 340 is brought into close contact with the first conductor plate 430 via a first sheet member 440 and a heat conduction member 453. The first sheet member 440 includes a first resin insulating layer 442 and a metal foil 444 in a laminated structure, and the metal foil 444 is in close contact with the heat conduction member 453.

The cooling member 340 is brought into close contact with the second conductor plate 431 via a second sheet member 441 and the heat conduction member 453. The second sheet member 441 includes a second resin insulating layer 443 and the metal foil 444 in a laminated structure, and the metal foil 444 is in close contact with the heat conduction member 453. From the viewpoint of heat dissipation, the width of the cooling member 340 is desirably wider than the widths of the sheet members 440 and 441.

As illustrated in FIG. 3, a second power semiconductor element forming a lower arm circuit includes an active element 157 and a diode 158 (see FIGS. 13 and 14 described later). In FIG. 3, the diode 158 is disposed back of the active element 157 in the X-axis direction. The collector of the active element 157 and the cathode of the diode 158 are joined to a fourth conductor plate 433. The emitter of the active element 157 and the anode of the diode 158 is joined to a third conductor plate 432.

As illustrated in FIG. 3, the first conductor plate 430, the second conductor plate 431, the third conductor plate 432, and the fourth conductor plate 433 serve as a heat transfer member that transfers heat generated by the first power semiconductor elements 155 and 156 and the second power semiconductor elements 157 and 158 to the cooling member 340, in addition to playing a role of passing a current. The conductor plates 430, 431, 432, and 433 are desirably made of a material having high electrical conductivity and high thermal conductivity, and examples of the conductor plate may include a metal-based material such as copper or aluminum, a composite material of a metal-based material and diamond, carbon, ceramic, and the like with high thermal conductivity. Since the conductor plates 430, 431, 432, and 433 and the cooling member 340 have different potentials, the first sheet member 440 having the first resin insulating layer 442 and the second sheet member 441 having the second resin insulating layer 443 are interposed between the conductor plates 430, 431, 432, and 433 and the cooling member 340 as illustrated in FIG. 2. The heat conduction member 453 is provided between each of the sheet members 440 and 441 and the cooling member 340 in order to reduce contact thermal resistance.

The heat conduction member 453 is not required to be a specific material as long as it is a material having high thermal conductivity, but it is preferable to include a high thermal conduction material such as a metal, a ceramic, or a carbon-based material in combination with a resin material. This is because the resin material is filled between the heat conduction member 453 and the cooling member 340 and between the heat conduction member 453 and each of the sheet members 440 and 441, and the contact thermal resistance is reduced. In addition, in order to suppress fluidity of the heat conduction member 453, the viscosity of the heat conduction member 453 is desirably 50 Pa·s or more.

The first power semiconductor elements 155 and 156, the second power semiconductor elements 157 and 158, the conductor plates 430, 431, 432, and 433, and the sheet members 440 and 441 are sealed with a sealing member 360 by transfer molding. The first resin insulating layer 442 and the second resin insulating layer 443 of each of the sheet members 440 and 441 are not required to be a specific material as long as they have adhesiveness with each of the conductor plates 430, 431, 432, and 433, but an epoxy resin-based resin insulating layer in which a powdery inorganic filler is dispersed is desirable. This is because the balance between adhesiveness and heat dissipation is good. Each of the sheet members 440 and 441 may be a single resin insulating layer, but it is desirable to include the metal foil 444 in contact with the heat conduction member 453.

In the transfer molding, when the sheet members 440 and 441 are mounted on a mold, a release sheet or the metal foil 444 is provided on a contact face between the sheet members 440 and 441 and the mold in order to prevent adhesion to the mold. Since the release sheet has poor thermal conductivity, a step of peeling off the release sheet after transfer molding is required. However, in the case of the metal foil 444, a step of peeling off after transfer molding is not required by selecting a copper-based or aluminum-based metal having high thermal conductivity. By performing transfer molding including the sheet members 440 and 441, the end of each of the sheet members 440 and 441 is covered with the sealing member 360, and there is an effect of improving the reliability of the product.

As illustrated in FIGS. 2 and 3, before the heat conduction member 453 and the cooling member 340 are joined, the sealing member 360 has a recess 454 formed along the outer edges of the sheet members 440 and 441 on the surface where the sheet members 440 and 441 are exposed, the recess being located outside the sheet members 440 and 441. Thereafter, the heat conduction member 453 covers at least the sheet members 440 and 441 exposed from the surface of the sealing member 360, and has a portion retained in the recess 454 of the sealing member 360.

The recess 454 of the sealing member 360 is formed by transfer molding using a mold in which a protrusion is formed corresponding to an outer periphery of each of the sheet members 440 and 441, which will be described in detail later. The shape of the recess 454 is desirably such that the bottom width thereof is shorter than the opening width. This is because the side face of the protrusion formed in the mold is inclined, so that the protrusion is easily provided, and subsequent processing or the like is not required. Further, as shown in FIG. 2, a height h1 of the recess 454 toward the sheet members 440 and 441 is desirably higher than a height h2 of the sealing member 360 at the end. This is because, when the width of cooling member 340 is increased to improve the heat dissipation or when the end of sealing member 360 warps in the direction of the cooling member 340 during the operation of the product, the end of sealing member 360 does not collide with the cooling member 340, resulting in a highly reliable structure.

Figure 4:
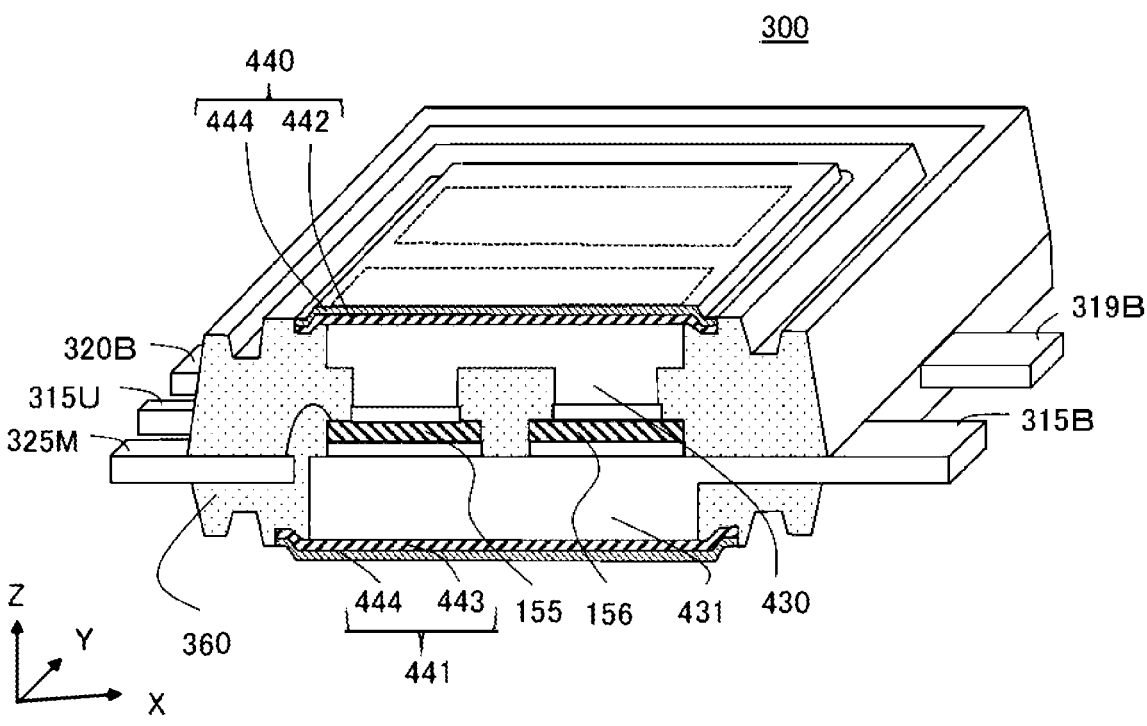
FIG. 4 is a cross-sectional perspective view of a power module taken along line X-X.

FIG. 4 is a cross-sectional perspective view of a power module 300 taken along line X-X illustrated in FIG. 1, and illustrates a state in which the cooling member 340 is removed from the electrical circuit body 400. As illustrated in FIG. 4, the end of the first sheet member 440 is covered with the sealing member 360. The first sheet member 440 overlapping the surface of the first conductor plate 430 serves as a heat dissipation surface. The cooling member 340 is brought into close contact with the heat dissipation surface of the first sheet member 440 so that the heat dissipation is not impaired.

Figure 5:
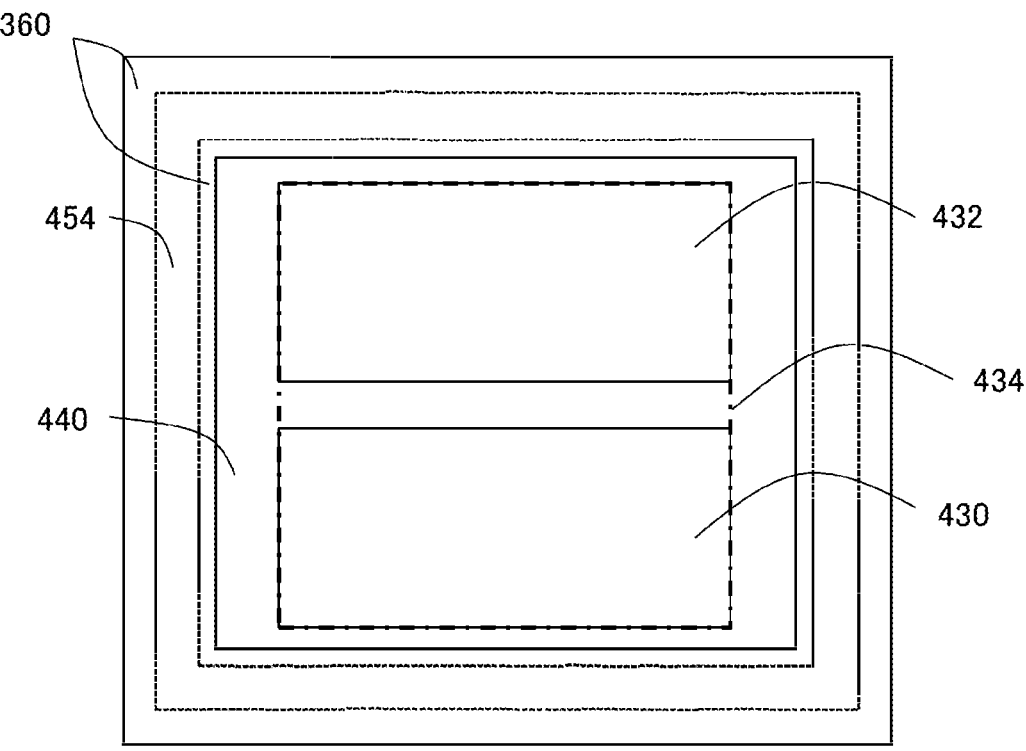
FIG. 5 is a plan cross-sectional view of the power module taken along line Z-Z.

FIG. 5 is a plan cross-sectional view of the power module 300 taken along line Z-Z illustrated in FIG. 2. A state in which the cooling member 340 and the heat conduction member 453 are removed from the electrical circuit body 400 illustrated in FIG. 2 is illustrated.

As illustrated in FIG. 5, the first sheet member 440 is provided so as to cover the first conductor plate 430 and the third conductor plate 432, and they are sealed with the sealing member 360. The sealing member 360 has the recess 454 formed around along the outer edge of the first sheet member 440 on the surface, the recess being located outside the first sheet member 440. The first sheet member 440 is positioned between the recess 454 of the sealing member 360 and the conductor plates 430 and 432. The first sheet member 440 desirably has a lateral width and a longitudinal width that are larger those of a conductor plate region 434 including the first conductor plate 430 and the third conductor plate 432. Specifically, the insulation distance between the end of the first sheet member 440 and the end of each of the first conductor plate 430 and the third conductor plate 432 is preferably 2 mm or more.

As described above, in the present embodiment, the insulation distance between the end of the first sheet member 440 and the end of each of the first conductor plate 430 and the third conductor plate 432 is secured, in other words, the first sheet member 440 is made wider than the first conductor plate 430 and the third conductor plate 432. As a result, even when the end of the first sheet member 440 is peeled off, the distance with the first conductor plate 430 and the third conductor plate 432 can be away, and there is an effect of improving the insulation.

Assume a case where the end of the first sheet member 440 aligns with the ends of the first conductor plate 430 and the third conductor plate 432 without securing an insulation distance between the end of the first sheet member 440 and the ends of the first conductor plate 430 and the third conductor plate 432. In this case, due to the frictional force at the time of manufacturing, the thermal stress at the time of operating as a product, and the like, the adhesiveness with the sealing member 360 is weakened and peeling easily occurs in the first sheet member 440. When peeling occurs in the first sheet member 440, since the end of the first sheet member 440 aligns with the ends of the first conductor plate 430 and the third conductor plate 432, the probability that the heat conduction member 453 covering the first sheet member 440 comes into contact with the ends of the first conductor plate 430 and the third conductor plate 432 increases. Since the heat conduction member 453 contains a material having a low insulating property, the insulating property is lowered when the heat conduction member 453 hangs down to the ends of the first conductor plate 430 and the third conductor plate 432.

Furthermore, in the present embodiment, as illustrated in FIG. 2, the heat conduction member 453 covers at least the first sheet member 440 exposed from the surface of the sealing member 360, and has a portion retained in the recess 454 of the sealing member 360. As a result, the heat conduction member 453 can be prevented from being squeezed out, insulation of the device can be secured, and reliability can be improved.

FIGS. 6(a) to 6(d) and FIGS. 7(e) to 7(g) are cross-sectional views illustrating a method of manufacturing the electrical circuit body 400. A cross-sectional view of one power module taken along line X-X illustrated in FIG. 1 is illustrated on the left side of each drawing, and a cross-sectional view of one power module taken along line Y-Y illustrated in FIG. 1 is illustrated on the right side of each drawing.

Figures 6A, 6B, 6C, 6D:
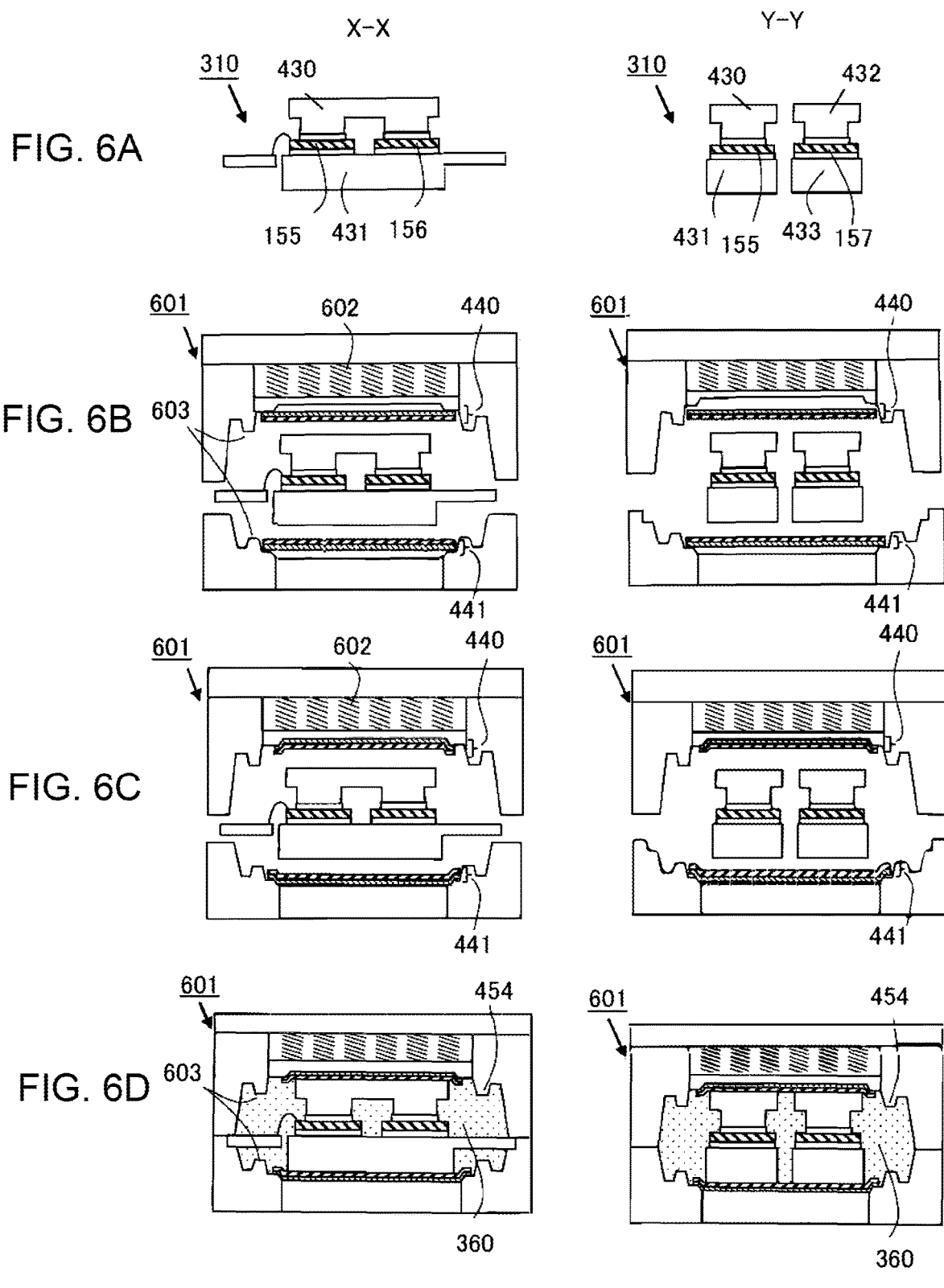
FIGS. 6A to 6D are cross-sectional views illustrating a method of manufacturing an electrical circuit body.

FIG. 6A is a view illustrating a solder connection step and a wire bonding step. The collector of the active element 155 and the cathode of the diode 156 as the first power semiconductor element are connected to the second conductor plate 431, and the gate electrode of the active element 155 is connected by wire bonding. The emitter of the active element 155 and the anode of the diode 156 are connected to the first conductor plate 430. Similarly, the collector of the active element 157 as the second power semiconductor element and the cathode of the diode 158 are connected to the fourth conductor plate 433, and the gate electrode of the active element 157 is connected by wire bonding. The emitter of the active element 157 and the anode of the diode 158 are connected to the third conductor plate 432. In this manner, a circuit body 310 is formed.

FIG. 6B is a view illustrating a mold installation step. The circuit body 310 and the sheet members 440 and 441 are installed in a mold in a transfer molding device 601. That is, the sheet members 440 and 441 are held by a mold in which a protrusion 603 is formed corresponding to an outer periphery of each of the sheet members 440 and 441.

Here, providing the protrusion 603 in the mold has an effect of easily aligning the sheet members 440 and 441. The ends of the sheet members 440 and 441 may be in contact with the protrusions 603, but it is desirable that the distance between the protrusions 603 at both ends provided in the mold be wider than the widths of the sheet members 440 and 441 within a range in which the positioning of the sheet members 440 and 441 does not have difficulties so that the ends of the sheet members 440 and 441 are not peeled off during molding. As described above, since each of the sheet members 440 and 441 is aligned with the protrusion 603 of the mold, it is possible to prevent a decrease in insulating property between the conductor plates 430, 431, 432, and 433 and the heat conduction member 453 due to displacement of the sheet members 440 and 441. That is, it is possible to prevent the sheet members 440 and 441 from being displaced with respect to the conductor plates 430, 431, 432, and 433, and the reliability is improved.

FIG. 6C is a diagram illustrating a transfer molding process. The transfer molding device 601 includes a mechanism for vacuum-attracting a spring 602 and the sheet members 440 and 441 to a mold and a vacuum degassing mechanism. The transfer molding device 601 holds the sheet members 440 and 441 positioned by the protrusion 603 of the mold in a mold heated to a constant temperature state of 175° C. in advance by vacuum, suction. The peripheral ends of the sheet members 440 and 441 are slightly bent in the direction in which the circuit body 310 is installed in accordance with the shape of the mold. Then, the circuit body 310 preheated to 175° C. is disposed at a position away from the sheet members 440 and 441. Next, the upper and lower molds are brought close to each other at a position where the sheet members 440 and 441 do not come into contact with the circuit body 310, and only the packings installed in the upper and lower molds (not illustrated) are brought into contact with each other.

FIG. 6D is a view illustrating a pressurizing step. In this step, the mold is pressurized to join the sheet members 440 and 441 to the other face (power semiconductor element is joined to one face of each of the conductor plates 430, 431, 432, and 433) of each of the conductor plates 430, 431, 432, and 433 to seal the sealing member 360, and the recess 454 is formed in the sealing member 360 corresponding to the protrusion 603 of the mold.

First, the upper and lower molds are brought close to each other from a state where the sheet members 440 and 441 and the circuit body 310 are away from each other, and only the packings installed around the upper and lower molds (not illustrated) are brought into contact with each other. Next, the mold cavity is evacuated. When evacuation to a predetermined atmospheric pressure or less is completed, the packing is further crushed, and the upper and lower molds are completely clamped. At this time, the sheet members 440 and 441 and the circuit body 310 are in contact with each other. In a vacuum state, the sheet members 440 and 441 and the circuit body 310 come into contact with each other and come into close contact with each other by pressurization by the spring 602, so that they come into close contact with each other without involving voids. Then, the sealing member 360 is injected into the mold cavity. Since the mold is provided with the protrusion 603, the sealing member 360 has the recess 454.

FIG. 7A is a view showing a curing step. The power module 300 sealed with the sealing member 360 is taken out from the transfer molding device 601, cooled at room temperature, and cured for 2 hours or more.

FIG. 7B is a view illustrating a step of installing the cooling member 340. In this step, the sheet members 440 and 441 exposed from the surface of the sealing member 360 are covered with the heat conduction member 453, and the cooling member 340 is bonded to the heat conduction member 453.

When the cooling member 340 is bonded to the heat conduction member 453, the heat conduction member 453 is pressed and a portion of the heat conduction member 453 is retained in the recess 454 formed in the sealing member 360. Then, the cooling member 340 is brought into close contact with the first sheet member 440 and the second sheet member 441 via the heat conduction member 453.

FIG. 7C is a view showing the electrical circuit body 400 manufactured by the above steps. The heat conduction member 453 is pressed and has a squeezed out portion in the lateral direction that is retained in the recess 454. In this way, the cooling member 340 is installed on each of both surfaces of the power module 300, and the electrical circuit body 400 is manufactured.

Figure 8A:
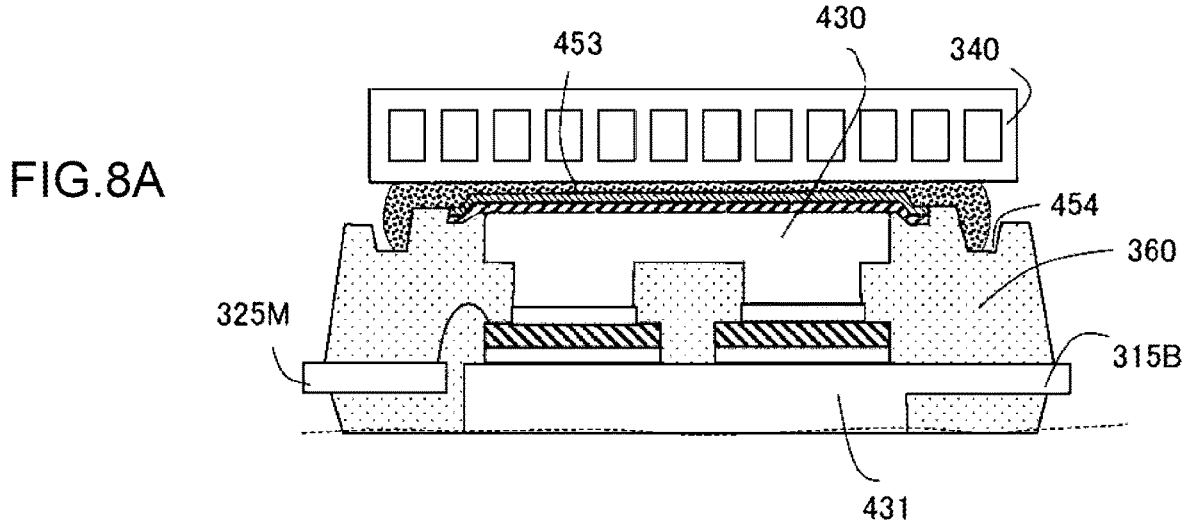
FIGS. 8A and 8B are a cross-sectional view of a main part of an electrical circuit body taken along line X-X and a cross-sectional view of a main part of a comparative example.
Figure 8B:
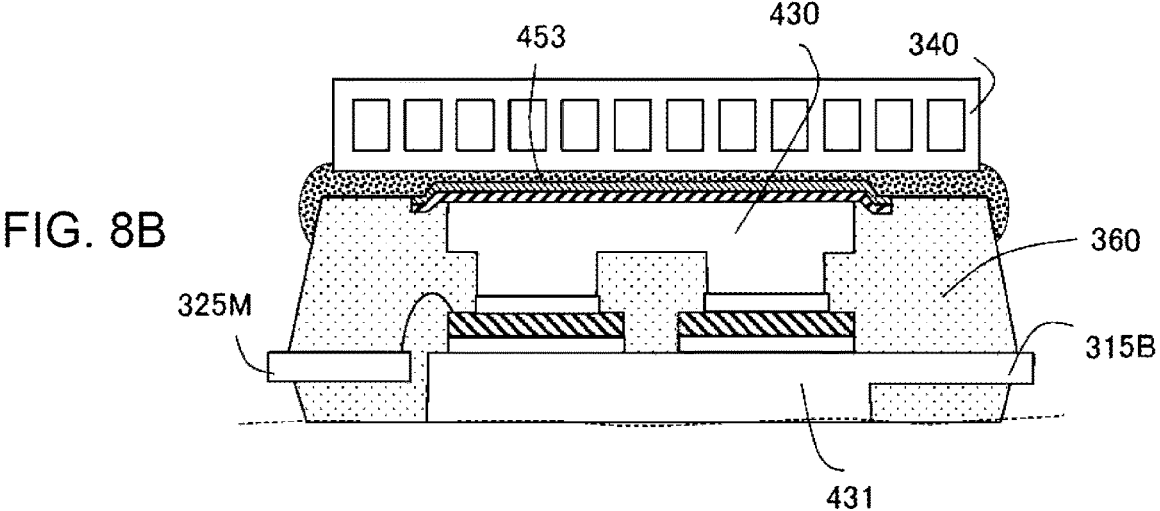

FIG. 8A is a cross-sectional view of a main part of the electrical circuit body 400 taken along line X-X shown in FIG. 1, and FIG. 8B is a cross-sectional view of a main part of a comparative example. In each case, the state of the heat conduction member 453 on the first conductor plate 430 side is illustrated.

As shown in FIG. 8A, in the present embodiment, the sealing member 360 has the recess 454 at the end. A mechanism in which the cooling member 340 sandwiches the power module 300 and is tightened and fixed from both sides with the screw is used. By tightening with the screw with a constant torque, the heat conduction member 453 interposed between the cooling member 340 and the power module 300 receives a constant surface pressure. Due to this surface pressure, the heat conduction member 453 is compressed, and from, the viewpoint of improving heat dissipation, the thinner the heat conduction member 453 is compressed, the lower the thermal resistance of the entire electrical circuit body 400 is. The compressed heat conduction member 453 is squeezed out in the lateral direction, and the squeezed out portion of the heat conduction member 453 is retained in the recess 454 of the sealing member 360, so that the heat conduction member hardly flows out to the outside of the electrical circuit body 400 and is prevented from hanging down to the terminals 315B and 325M. This prevents the heat conduction member 453 from being squeezed out, secures insulation, and improves reliability of the device.

On the other hand, in the comparative example illustrated in FIG. 8B to which the present embodiment is not applied, the sealing member 360 has no recess. In this case, when the cooling member 340 and the power module 300 are fixed, there is a possibility that the heat conduction member 453 is squeezed out in the lateral direction and flows out along the sealing member 360. Since the heat conduction member 453 contains a material having a low insulating property, when the heat conduction member 453 hangs down to the terminals 315B and 325M, the insulating property cannot be secured, and the reliability of the device is lowered.

Figure 9:
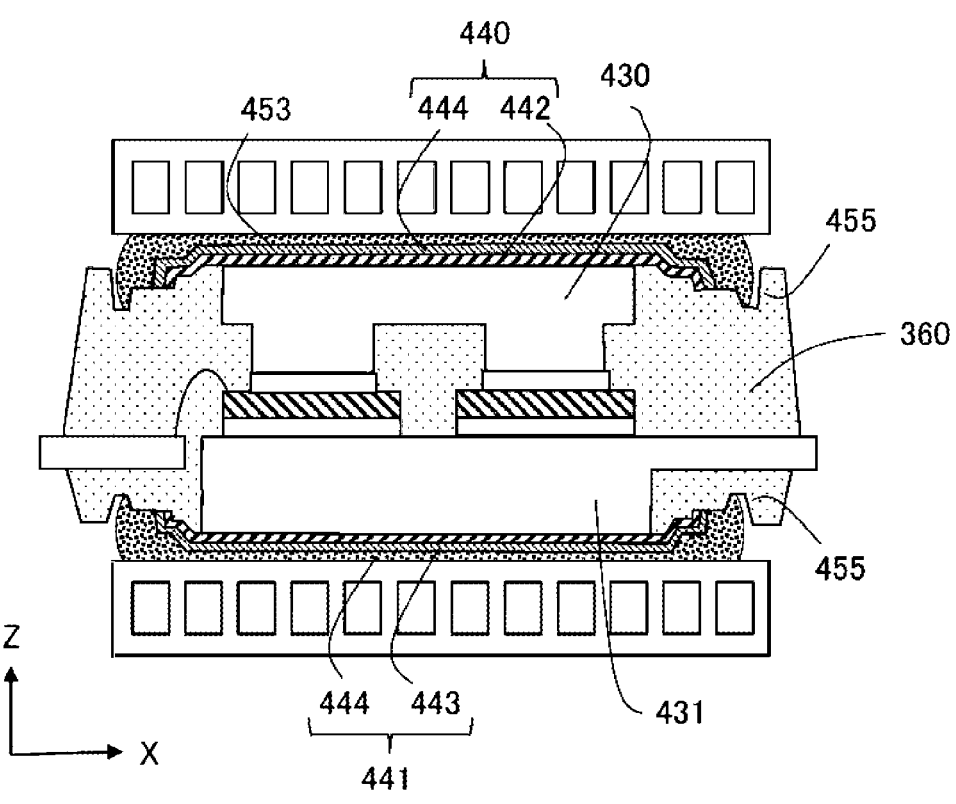
FIG. 9 is a cross-sectional view of an electrical circuit body taken along line X-X in the first modification.

FIG. 9 is a cross-sectional view of the electrical circuit body 400 taken along line X-X illustrated in FIG. 1 according to the first modification.

In the first modification, a recess 455 of the sealing member 360 has a stepped shape in which the bottom face is deeper at the outer periphery that is outside the sheet member 440. The recess 455 has a shallow portion, of the bottom face, which is filled with the end of the sheet member 440, and the has recess 455 has a deep portion, of the bottom face, where the heat conduction member 453 is retained. Although the method for manufacturing the sealing member 360 is omitted, the mold is provided with another step inside the protrusion, and the sheet member 440 is temporarily placed on the step of the protrusion to align the sheet member 440. The heat conduction member 453 has a lateral width and a longitudinal width that are larger those of the sheet member 440. This produces an effect of securing an insulation distance with the conductor plates 430 and 431. In addition, when the recess 455 of the sealing member 360 is filled with the end of the sheet member 440, the heat conduction member 453 is in contact with the sheet member 440, so that there is an effect that the heat dissipation of the entire electrical circuit body 400 is improved.

Figure 10:
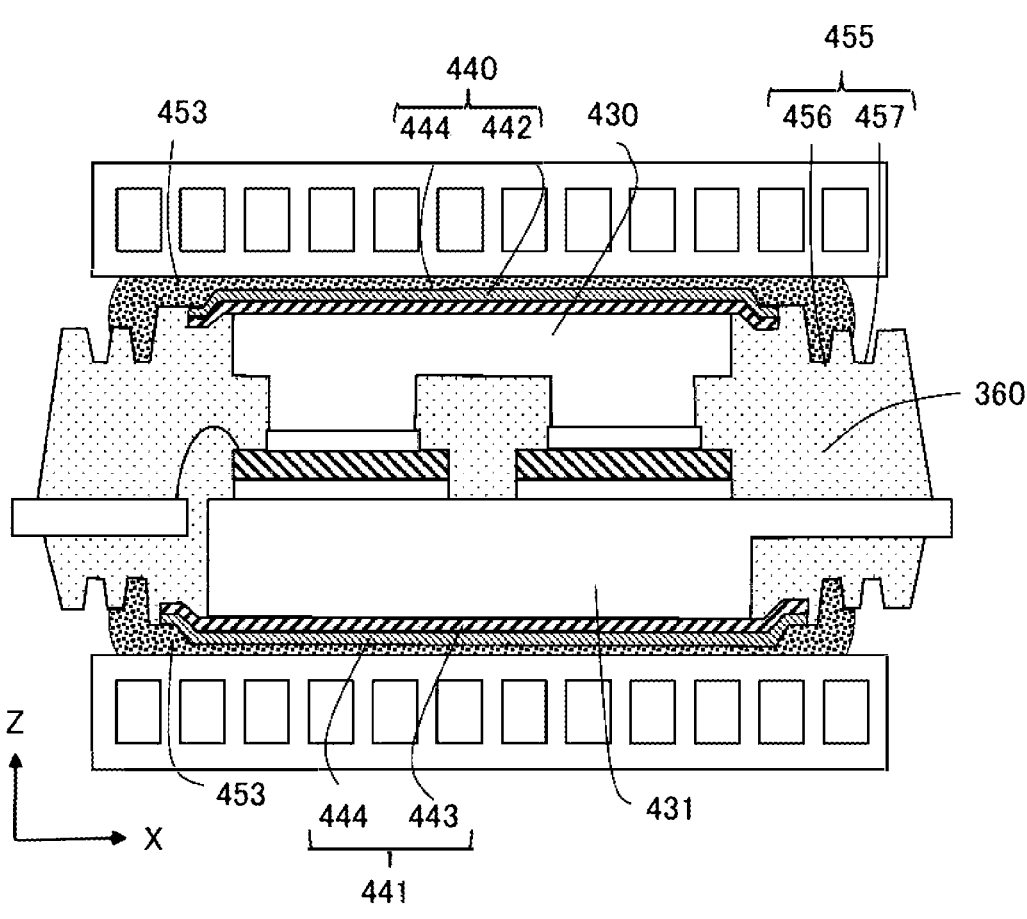
FIG. 10 is a cross-sectional view of an electrical circuit body taken along line X-X in the second modification.

FIG. 10 is a cross-sectional view of the electrical circuit body 400 taken along line X-X illustrated in FIG. 1 according to the second modification.

In the second modification, the recess 455 of the sealing member 360 includes a plurality of recesses including a first recess 456 and a second recess 457, the recess being located outside the sheet member 440. In the example of FIG. 10, an example in which the number of recesses 455 is two is shown. Then, the heat conduction member 453 is retained in the first recess 456 and the second recess 457. Although the method for manufacturing the sealing member 360 is omitted, the mold is provided with a plurality of protrusions, and the sheet member 440 is temporarily placed on the innermost peripheral side protrusion to align the sheet member 440. As described in the first modification, the first recess 456 may be filled with the end of the sheet member 440, and may retain the heat conduction member 453.

According to the second modification, when the heat conduction member 453 is squeezed out, since the entire first recess 456 is filled and then the second recess 457 is filled, the effect of preventing protrusion is increased. In addition, in the electrical circuit body 400, the three power modules 300 are disposed (see FIG. 1), and there is little space to receive the heat conduction member 453 squeezed out in the direction (X direction) in which the power modules 300 are disposed, so that the heat conduction member 453 tends to be squeezed out in the terminal direction (Y direction). As shown in the second modification, when the sealing member 360 has a plurality of recesses, the heat conduction member 453 increased in the Y direction is received by the plurality of recesses in the Y direction, and there is an effect that the heat conduction member 453 is not allowed to flow out to the outside of the electrical circuit body 400.

Figure 11:
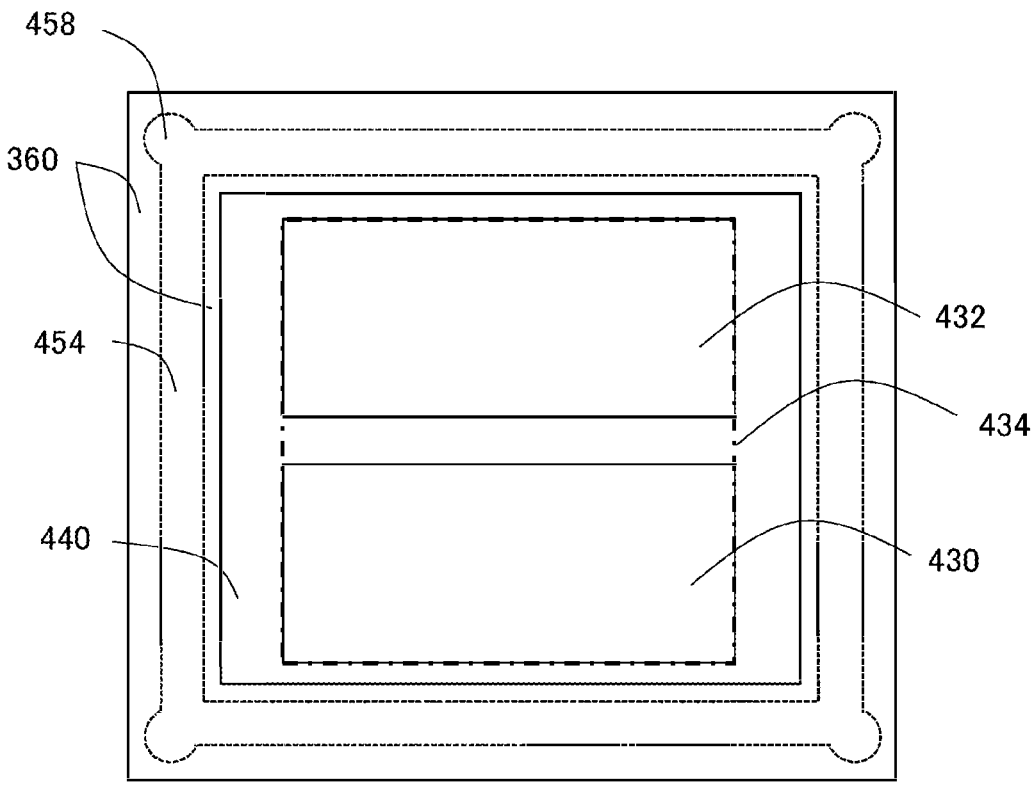
FIG. 11 is a plan cross-sectional view of a power module taken along line Z-Z in the third modification.

FIG. 11 is a diagram corresponding to a plan cross-sectional view of the power module 300 taken along line Z-Z illustrated in FIG. 2 in the third modification. A state in which the cooling member 340 and the heat conduction member 453 are removed from the electrical circuit body 400 illustrated in FIG. 2 is illustrated.

As illustrated in FIG. 11, a first sheet member 440 is provided so as to cover the first conductor plate 430 and the third conductor plate 432, and they are sealed with the sealing member 360. The sealing member 360 has the recess 454 formed around along the outer edge of the first sheet member 440 on the surface, the recess being located outside the first sheet member 440. The first sheet member 440 is positioned between the recess 454 of the sealing member 360 and the conductor plates 430 and 432. Both the horizontal width and the vertical width of the first sheet member 440 are desirably wider than the horizontal width and the vertical width of the conductor plate region 434 including the first conductor plate 430 and the third conductor plate 432.

In the third modification, a retention region 458 in which the heat conduction member 453 is retained is formed at a corner of the recess 454 formed along the outer edge of the first sheet member 440. The capacity of the retention region 458 is larger than the capacity of the corner of the recess 454 when the retention region 458 is not formed. The shape of the retention region 458 may be any shape such as a circular shape or a quadrangular shape. In the example illustrated in FIG. 11, the retention region 458 has a circular shape, is provided at four corners of the recess 454, and has a structure of protruding out of the outer periphery of the recess 454.

According to the third modification, when the heat conduction member 453 is squeezed out, the capacity for receiving the heat conduction member 453 increases, and the effect of preventing the heat conduction member 453 from being squeezed out increases. In addition, as described in the second modification, when the heat conduction member 453 squeezed out in the direction in which the power modules 300 are disposed is further squeezed out in the terminal direction, the heat conduction member tends to concentrate on the corner of the recess 454. Therefore, by increasing the capacity of the corner of the recess 454, the effect of preventing the member from being squeezed out increases.

Figure 12:
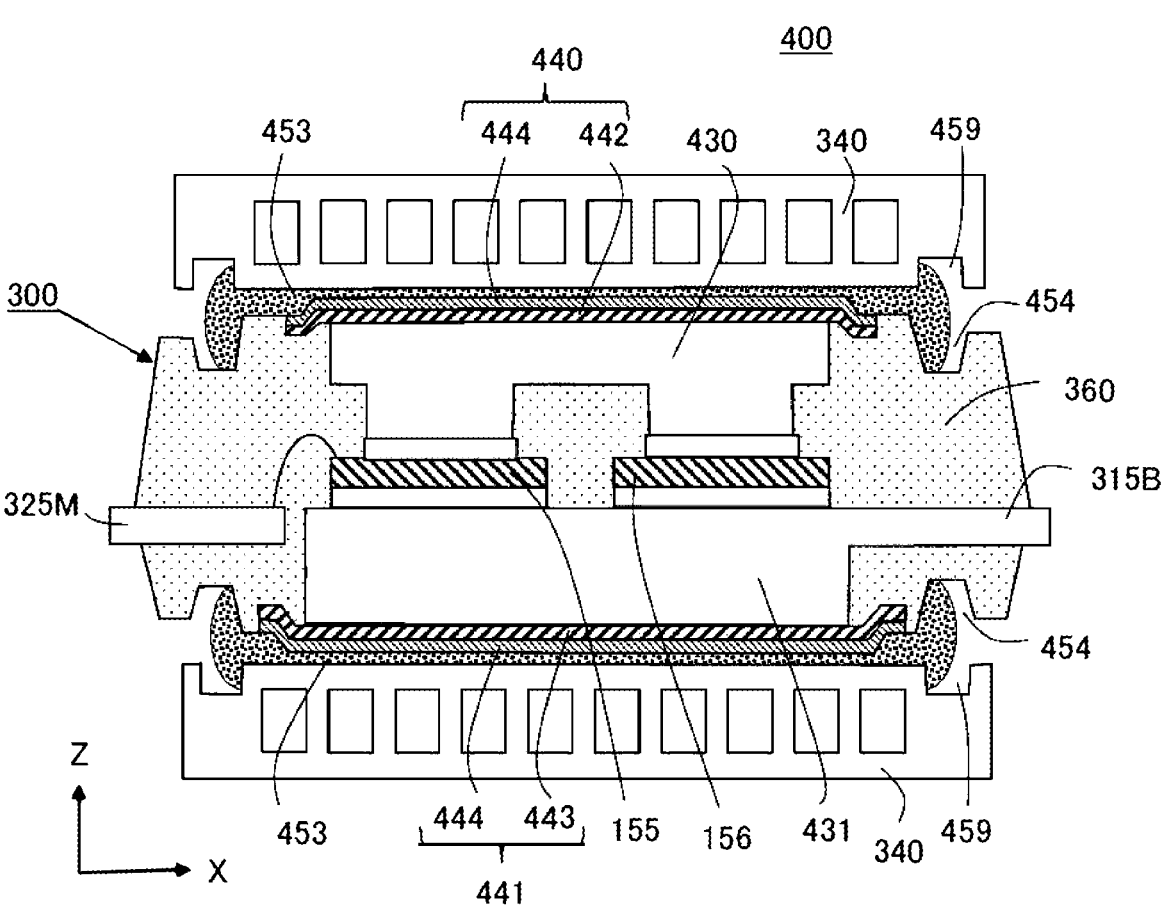
FIG. 12 is a cross-sectional view of an electrical circuit body taken along line X-X in the fourth modification.

FIG. 12 is a view corresponding to a cross-sectional view of the electrical circuit body 400 taken along line X-X shown in FIG. 1 according to the fourth modification. The same portions as those in the cross-sectional view illustrated in FIG. 2 are denoted by the same reference numerals, and the description thereof will be omitted.

In the fourth modification, the cooling member 340 has a recess 459 formed along the outer edges of the sheet members 440 and 441, the recess being located outside the sheet members 440 and 441. The recess 459 faces the recess 454 of the sealing member 360. Then, the squeezed out heat conduction member 453 is retained in the recess 459. A retention region in which the heat conduction member 453 is retained may be formed at a corner of the recess 459 formed in the cooling member 340.

According to the fourth modification, when the heat conduction member 453 is squeezed out, the heat conduction member is retained in the recess 454 and the recess 459, so that the capacity for receiving the heat conduction member 453 increases, and the effect of preventing the member form being squeezed out.

Figure 13:
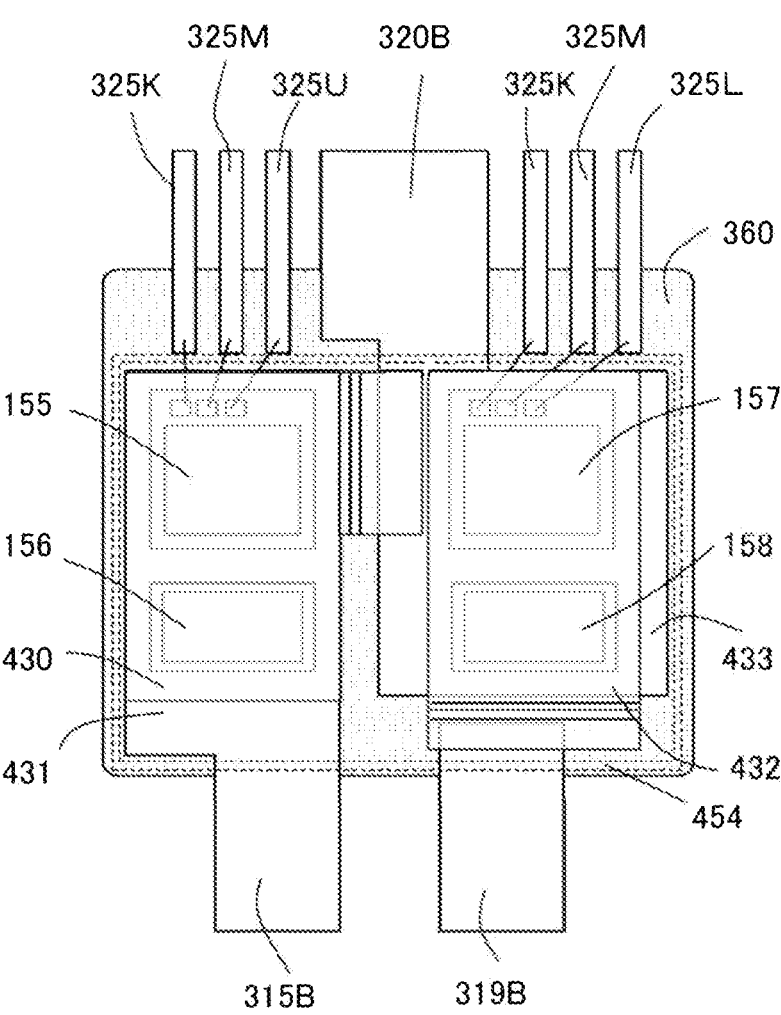
FIG. 13 is a semi-transparent plan view of the power module in the present embodiment.

FIG. 13 is a semi-transparent plan view of the power module 300 according to the present embodiment. FIG. 14 is a circuit diagram of the power module 300 according to the present embodiment.

Figure 14:
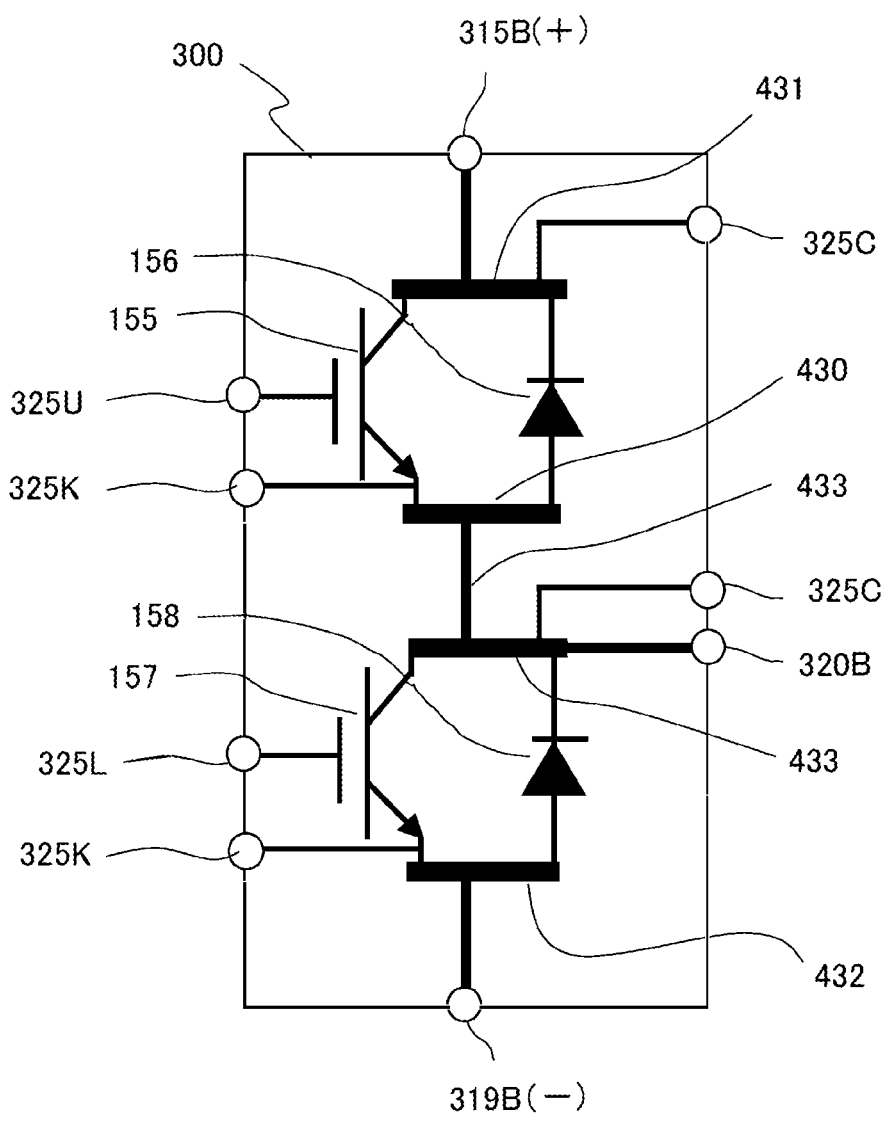
FIG. 14 is a circuit diagram of the power module according to the present embodiment.

As shown in FIGS. 13 and 14, the positive electrode terminal 315E is output from the collector of the upper arm circuit, and is connected to the positive electrode of the battery or the capacitor. The upper arm gate signal terminal 325U is output from the gate and emitter sense of the active element 155 of the upper arm circuit. The negative electrode terminal 319B is output from the emitter of the lower arm circuit, and is connected to the negative electrode of the battery or the capacitor or GND. The lower arm gate signal terminal 325L is output from the gate and the emitter sense of the active element 157 of the lower arm circuit. The AC terminal 320B is output from the collector of the lower arm circuit and is connected to the motor. When the neutral point is grounded, the lower arm circuit is connected not to GND but to the negative electrode of the capacitor.

In addition, a first conductor plate (upper arm circuit emitter side) 430 and a second conductor plate (upper arm circuit collector side) 431 are disposed above and below the active element 155 and the diode 156 of the first power semiconductor element (upper arm circuit). A third conductor plate (lower arm circuit emitter side) 432 and a fourth conductor plate (lower arm circuit collector side) 433 are disposed above and below the active element 157 and the diode 158 of the second power semiconductor element (lower arm circuit).

The sealing member 360 has the recess 454 formed around along the outer edge of the first sheet member 440 on the surface, the recess being located outside the first sheet member 440 (not illustrated).

The power module 300 of the present embodiment has a 2 in 1 structure in which two arm circuits of an upper arm circuit and a lower arm circuit are integrated into one module. In addition, a structure in which a plurality of upper arm circuits and a plurality of lower arm circuits are integrated into one module may be used. In this case, the number of output terminals from the power module 300 can be reduced and downsized.

Figure 15:
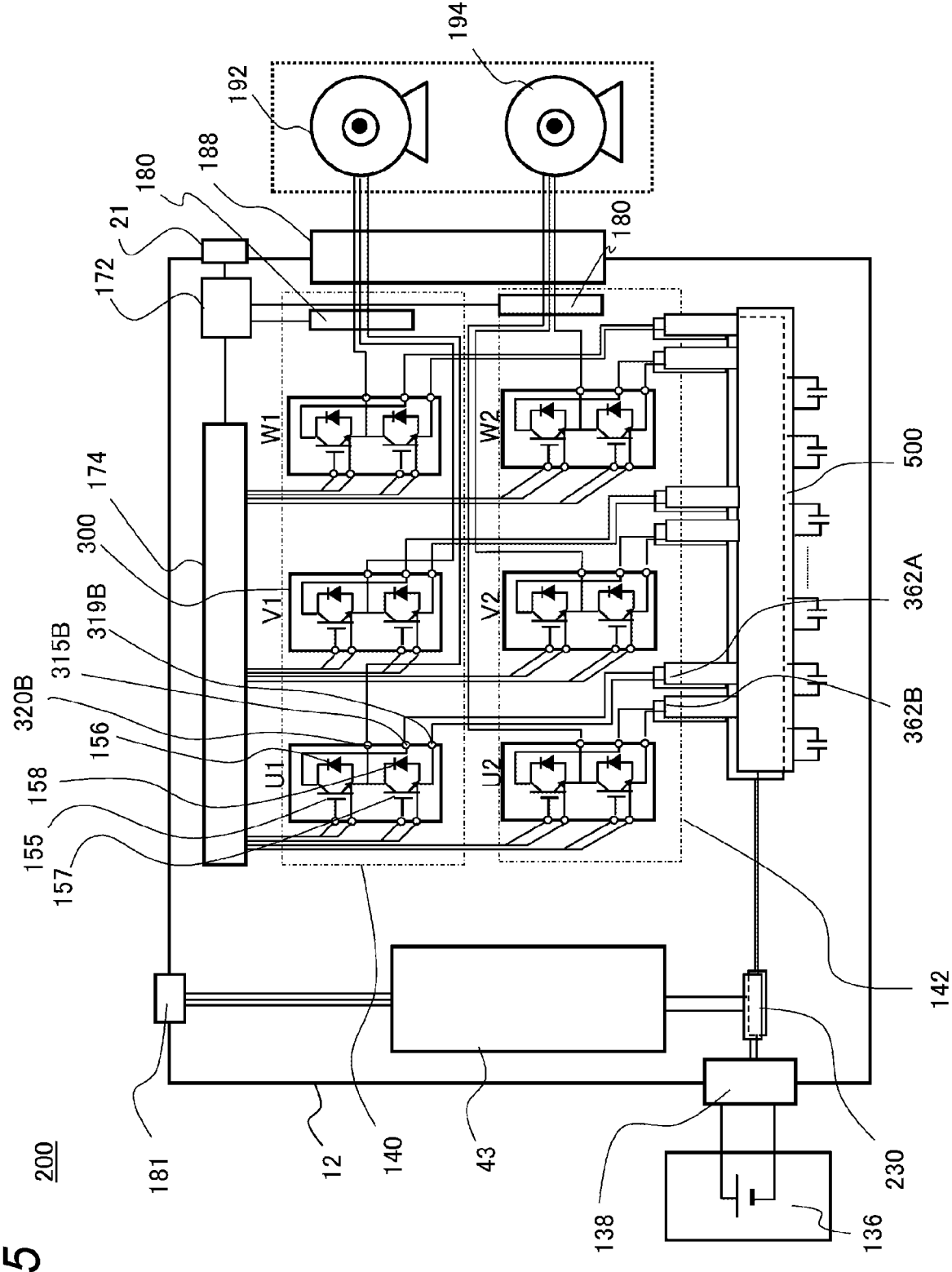
FIG. 15 is a circuit diagram of a power converter including an electrical circuit body.

FIG. 15 is a circuit diagram of a power converter 200 including the electrical circuit body 400.

The power converter 200 includes inverter circuits 140 and 142, an auxiliary inverter circuit 43, and the capacitor module 500. The inverter circuits 140 and 142 are configured by the electrical circuit body 400 (not illustrated) including a plurality of power modules 300, and has a three-phase bridge circuit by connecting them. When the current capacity is large, the power modules 300 are further connected in parallel, and the parallel connection is performed corresponding to each phase of the three-phase inverter circuit, so that it is possible to cope with an increase in the current capacity. In addition, by connecting the active elements 155 and 157 and the diodes 156 and 158, which are power semiconductor elements incorporated in the power module 300, in parallel, it is also possible to cope with an increase in current capacity.

The inverter circuit 140 and the inverter circuit 142 basically have the same circuit configuration, and have basically the same control method and operation. Since an outline of a circuit operation of the inverter circuit 140 and the like is well known, a detailed description thereof will be omitted here.

As described above, the upper arm circuit includes the upper arm active element 155 and the upper arm diode 156 as switching, power semiconductor elements and the lower arm circuit includes the lower arm active element 157 and the lower arm diode 158 as switching power semiconductor elements. The active elements 155 and 157 perform a switching operation in response to a driving signal output from one or the other of the two driver circuits constituting the driver circuit 174, and convert DC power supplied from the battery 136 into three-phase AC power.

As described above, each of the upper arm active element 155 and the lower arm active element 157 includes a collector electrode, an emitter electrode, and a gate electrode. Each of the upper arm diode 156 and the lower arm diode 158 includes two electrodes of a cathode electrode and an anode electrode. As shown in FIG. 13, cathode electrodes of the diodes 156 and 158 are electrically connected to collector electrodes of the active elements 155 and 157, respectively, and anode electrodes are electrically connected to emitter electrodes of the active elements 155 and 157, respectively. As a result, the current flows in the forward direction from the emitter electrode to the collector electrode of each of the upper arm active element 155 and the lower arm active element 157.

An example of the active element may include a metal oxide semiconductor field effect transistor (MOSFET), and in this case, the upper arm diode 156 and the lower arm diode 158 are unnecessary.

The positive electrode terminal 315B and the negative electrode terminal 319B of each upper and lower arm series circuit are connected to capacitor connection DC terminals 362A and 362B of the capacitor module 500, respectively. AC power is generated at the connection portion between the upper arm circuit and the lower arm circuit, and the connection portion between the upper arm circuit and the lower arm circuit of each upper and lower arm series circuit is connected to the AC terminal 320B of each power module 300. The AC terminal 320B of each power module 300 of each phase is connected to the AC output terminal of the power converter 200, and the generated AC power is supplied to the stator winding of the motor generator 192 or 194.

A control circuit 172 generates a timing signal for controlling switching timing of the upper arm active element 155 and the lower arm active element 157 based on input information from a control device, a sensor (for example, the current sensor 180), and the like of the vehicle. A driver circuit 174 generates a driving signal for switching the upper arm active element 155 and the lower arm active element 157 based on the timing signal output from the control circuit 172. Note that reference numerals 181, 182, and 188 denote connectors.

The upper and lower arm series circuit includes a temperature sensor (not illustrated), and temperature information of the upper and lower arm series circuit is input to the control circuit 172. Information about voltage of the DC positive electrode of the upper and lower arm series circuit is input to the control circuit 172. The control circuit 172 performs overtemperature detection and overvoltage detection based on the information, stops the switching operation of all the upper arm active elements 155 and the lower arm active elements 157 when overtemperature or overvoltage is detected, and protects the upper and lower arm series circuit from overtemperature or overvoltage.

Figure 16:
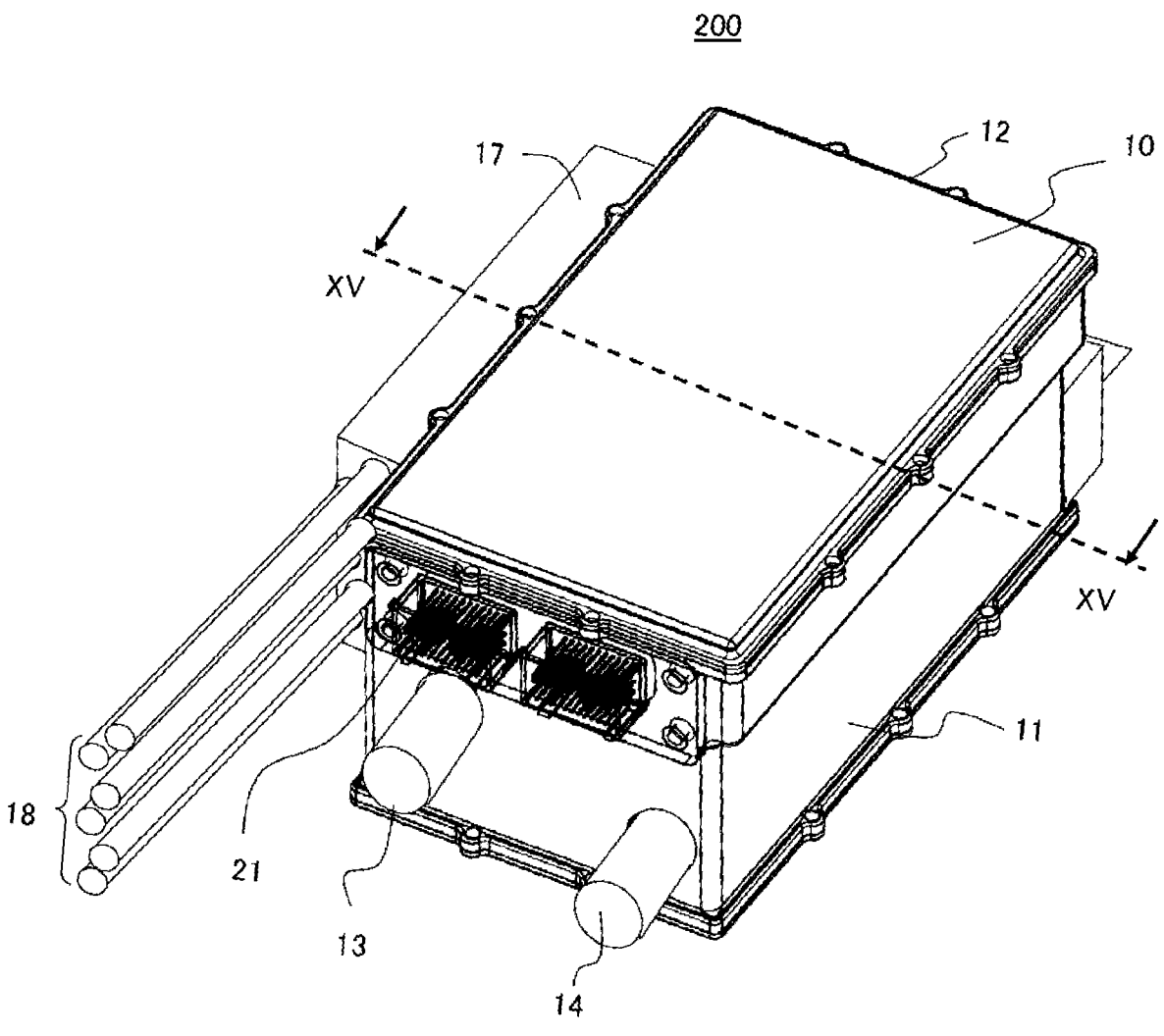
FIG. 16 is an external perspective view of the power converter.
Figure 17:
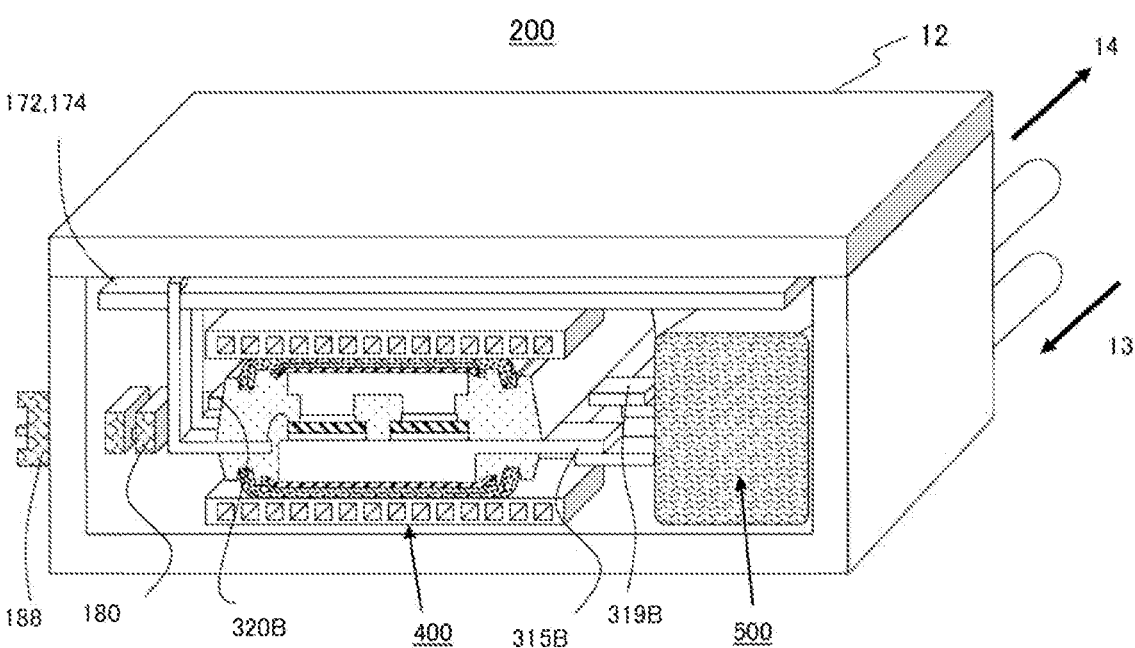
FIG. 17 is a cross-sectional perspective view of the power converter taken along line XV-XV.

FIG. 16 is an external perspective view of the power converter 200 illustrated in FIG. 15, and FIG. 17 is a cross-sectional perspective view of the power converter 200 illustrated in FIG. 16, taken along line XV-XV.

As illustrated in FIG. 16, the power converter 200 includes a casing 12 that includes a lower case 11 and an upper case 10 and is formed in a substantially rectangular parallelepiped shape. The electrical circuit body 400, the capacitor module 500, and the like are accommodated in the casing 12. The electrical circuit body 400 has a cooling flow path, and a cooling water inflow pipe 13 and a cooling water outflow pipe 14 communicating with the cooling flow path protrude from one side face of the casing 12. The lower case 11 has an opening on the upper side (Z direction), and the upper case 10 is attached to the lower case 11 by closing the opening of the lower case 11. The upper case 10 and the lower case 11 are formed of an aluminum alloy or the like, and are sealed and fixed to the outside. The upper case 10 and the lower case 11 may be integrated. Since the casing 12 has a simple rectangular parallelepiped shape, attachment to a vehicle or the like is facilitated, and productivity is also improved.

A connector 17 is attached to one side face of the casing 12 in the longitudinal direction, and an AC terminal 18 is connected to the connector 17. A connector 21 is provided on a face from which the cooling water inflow pipe 13 and the cooling water outflow pipe 14 are led out.

As illustrated in FIG. 17, the electrical circuit body 400 is accommodated in the casing 12. The control circuit 172 and the driver circuit 174 are disposed above the electrical circuit body 400, and a capacitor module 500 is accommodated near the DC terminal of the electrical circuit body 400. By disposing the capacitor module at the same height as the electrical circuit body 400, the power converter 200 can be thinned, and the degree of freedom in installation on the vehicle is improved. The AC terminal 320B of the electrical circuit body 400 penetrates a current sensor 180 and is joined to the bus bar. The positive electrode terminal 315B and the negative electrode terminal 319B, which are DC terminals of the electrical circuit body 400, are joined to positive and negative electrode terminals (DC terminals 362A and 362B in FIG. 13, respectively) of the capacitor module 500.

According to the embodiment described above, the following functions and effects can be obtained.

(1) The electrical circuit body 400 includes the power semiconductor element 155, 156, 157, 158 joined to one face of the conductor plate 430, 431, 432, 433, the sheet member 440, 441 including an insulating layer joined to the other face of the conductor plate 430, 431, 432, 433, the sealing member 360 integrally sealing the sheet member 440, 441, the conductor plate 430, 431, 432, 433, and the power semiconductor element 155, 156, 157, 158 in a state where a face, of the sheet member 440, 441, opposite to a face joined to the conductor plate 430, 431, 432, 433 is exposed, and the cooling member 340 bonded to the opposite face of the sheet member 440, 441 via the heat conduction member 453, wherein the sealing member 360 has the recess 454, 455 along an outer edge of the sheet member 440, 441 on a surface where the sheet member 440, 441 is exposed, the recess being located outside the sheet member 440, 441. This prevents the heat conduction member from being squeezed out, secures insulation, and improves reliability of the device.

(2) In a method for manufacturing the electrical circuit body 400, where the electrical circuit body 400 includes the power semiconductor element 155, 156, 157, 158 joined to one face of the conductor plate 430, 431, 432, 433, the sheet member 440, 441 including an insulating layer joined to the other face of the conductor plate 430, 431, 432, 433, the sealing member 360 integrally sealing the sheet member 440, 441, the conductor plate 430, 431, 432, 433, and the power semiconductor element 155, 156, 157, 158 in a state where a face, of the sheet member 440, 441, opposite to a face joined to the conductor plate 430, 431, 432, 433 is exposed, and the cooling member 340 bonded to the opposite face of the sheet member 440, 441 via the heat conduction member 453, the method includes holding the sheet member 440, 441 by a mold in which the protrusion 603 is formed corresponding to an outer periphery of the sheet member 440, 441, pressurizing the mold to Thin the sheet member 440, 441 to the other face of the conductor plate 430, 431, 432, 433, performing sealing with the sealing member 360, and forming the recess 454, 455, in the sealing member 360, corresponding to the protrusion 603 of the mold. This prevents the heat conduction member from being squeezed out, secures insulation, and improves reliability of the device.

The present invention is not limited to the above-described embodiments, and other forms conceivable within the scope of the technical idea of the present invention are also included within the scope of the present invention as long as the features of the present invention are not impaired. In addition, the above-described embodiment and a plurality of modifications may be combined.

REFERENCE SIGNS LIST 1 microcomputer
10 upper case
11 lower case
12 casing
13 cooling water inflow pipe
14 cooling water outflow pipe
17 connector
18 AC terminal
21 connector
43, 140, 142 inverter circuit
155 first power semiconductor element (upper arm circuit active element)
156 first power semiconductor element (upper arm circuit diode)
157 second power semiconductor element (lower arm circuit active element)
158 second power semiconductor element (lower arm circuit diode)
172 control circuit
174 driver circuit
180 current sensor
181, 182, 188 connector
192, 194 motor generator
200 power converter
300 power module
310 circuit body
315B positive electrode terminal
319B negative electrode terminal
320B AC terminal
325 signal terminal
325K Kelvin emitter signal terminal
325L lower arm gate signal terminal
325M mirror emitter signal terminal
325U upper arm gate signal terminal
340 cooling member
360 sealing member
400 electrical circuit body
430 first conductor plate (upper arm circuit emitter side)
431 second conductor plate (upper arm circuit collector side)

432 third conductor plate (lower arm circuit emitter side)

433 fourth conductor plate (lower arm circuit collector side)

440 first sheet member (emitter side)

441 second sheet member (collector side)

442 first resin insulating layer (emitter side)

443 second resin insulating layer (collector side)

444 metal foil

453 heat conduction member

454, 455 recess of sealing member

458 retention region

459 recess of cooling member

500 capacitor module

601 transfer molding device

602 spring

603 protrusion of mold

The invention claimed is:

1. An electrical circuit body comprising: a power semiconductor element joined to one face of a conductor plate; a sheet member including an insulating layer joined to another face of the conductor plate; a sealing member integrally sealing the sheet member, the conductor plate, and the power semiconductor element in a state where a face, of the sheet member, opposite to a face joined to the conductor plate is exposed; and a cooling member bonded to the opposite face of the sheet member via a heat conduction member, wherein the sealing member has a recess along an outer edge of the sheet member on a surface where the sheet member is exposed, the recess being located outside the sheet member, the recess corresponding to a protrusion of a mold, the protrusion being formed so as to correspond to an outer periphery of the sheet member.

2. The electrical circuit body according to claim 1, wherein the heat conduction member covers at least the sheet member exposed from a surface of the sealing member, and has a portion retained in the recess of the sealing member.

3. The electrical circuit body according to claim 1, wherein the recess has a stepped bottom face.

4. The electrical circuit body according to claim 1, wherein the recess includes a plurality of recesses.

5. The electrical circuit body according to claim 1, wherein the recess is filled with an end of the sheet member.

6. The electrical circuit body according to claim 1, wherein a corner of the recess formed along an outer edge of the sheet member has a retention region in which the heat conduction member is retained.

7. The electrical circuit body according to claim 1, wherein the cooling member has a recess formed along an outer edge of the sheet member, the recess being located outside the sheet member.

8. The electrical circuit body according claim 1, wherein the conductor plate is disposed at each of both surfaces of the power semiconductor element, and the disposed conductor plate has one face joined to the power semiconductor element, the sheet member is joined to the other face of the conductor plate, and the cooling member is bonded to the sheet member via the heat conduction member.

9. A power converter comprising the electrical circuit body according to claim 1, wherein DC power is converted into AC power.

10. A method for manufacturing an electrical circuit body, the electrical circuit body including a power semiconductor element joined to one face of a conductor plate, a sheet member including an insulating layer joined to another face of the conductor plate, a sealing member integrally sealing the sheet member, the conductor plate, and the power semiconductor element in a state where a face, of the sheet member, opposite to a face joined to the conductor plate is exposed, and a cooling member bonded to the opposite face of the sheet member via a heat conduction member, the method comprising:

holding the sheet member by a mold in which a protrusion is formed corresponding to an outer periphery of the sheet member; and pressurizing the mold to join the sheet member to the other face of the conductor plate, performing sealing with the sealing member, and forming a recess, in the sealing member, corresponding to the protrusion of the mold.

11. The method for manufacturing an electrical circuit body according to claim 10, the method further comprising covering the sheet member exposed from a surface of the sealing member with the heat conduction member and bonding the cooling member to the heat conduction member.

* * * * *